United States Patent Office 3,682,642

Patented Aug. 8, 1972

3,682,642

PHOTOPOLYMERIZATION OF ETHYLENICALLY UNSATURATED ORGANIC COMPOUNDS

Urbain Leopold Laridon, 36 Damhertenlaan, 2610 Wilrijk, Belgium; Gerard Albert Delzenne, 40 Graaf Charles Cornetlaar, S2232 Gravenwezel, Belgium; Albert Lucien Poot, 2 Kenipnenveld, 2550 Kontich, Belgium; and Hugo Karel Peeters, 9 Graaf d'Urselstraat, 2510 Mortsel, Belgium No Drawing. Filed Aug. 24, 1970, Ser. No. 66,588

Claims priority, application Great Britain, Nov. 11, 1969, 55,236/69

Int. Cl. G03c *1/68*

U.S. Cl. 96—115 R 20 Claims

ABSTRACT OF THE DISCLOSURE

Photographic elements are described comprising a support and a light-sensitive layer containing a photopolymerizable ethylenically unsaturated organic compound and a photopolymerization initiator containing at least one diacyldiazomethane group having the formulae:

$$X-\underset{\underset{N_2}{\|}}{C}-Y$$

or $$X-\underset{\underset{N_2}{\|}}{C}-SO_2-Z-SO_2-\underset{\underset{N_2}{\|}}{C}-Y$$

wherein:

each of X and Y (same or different) represents acyl groups selected from R—$SO_2$— and R′—CO— with R representing a phenyl group, a naphthyl group, a halogen-substituted phenyl group, an alkyl-substituted phenyl group, wherein the alkyl group comprises 1 to 12 carbon atoms, a nitro-substituted phenyl group, or a carboxyl-substituted phenyl group, wherein the carboxyl group occurs in free acid form or as an alkaline metal salt group, or as an alkyl or a phenyl ester group, and with R′ representing a phenyl group, a naphthyl group, a benzofuran group, a halogen-substituted phenyl group, an alkyl-substituted phenyl group, wherein the alkyl group comprises 1 to 4 carbon atoms, an alkoxy-substituted phenyl group, wherein the alkoxy group comprises 1 to 16 carbon atoms, a nitro-substituted phenyl group, a dialkylamino-substituted phenyl group, wherein the alkyl groups comprise 1 to 4 carbon atoms, or a carboxyl-substituted phenyl group, wherein the carboxyl group occurs in free acid form or as an alkali metal salt group, or as an alkyl or a phenyl ester group, and Z represents an alkylene group of 2 to 4 carbon atoms or a phenylene group.

The photographic elements are highly reactive requiring only a very short exposure to actinic light.

The present invention relates to the photopolymerization of ethylenically unsaturated organic compounds and tc polymers obtained therefrom.

The photopolymerization of ethylenically unsaturated organic compounds can be initiated by exposure to high-intensity radiation such as ultraviolet rays. For instance, methyl acrylate standing a long time in sunlight is transformed into a transparent mass (cf. Ellis: The Chemistry of Synthetic Resins, vol. II (1935) page 1072.) Polymerization, however, with light alone proceeds at a very much slower rate than the polymerization brought about by a free radical-generating catalyst or by heat. Moreover, the use of light alone, unaided by other agents, requires very long exposure times in order to polymerise the monomer sufficiently. Furthermore, the low rate of polymerization necessitates the use of extremely intense radiations such as those obtained from high-intensity mercury vapour lamps or carbon arcs.

Many photopolymerization initiators, which under the influence of actinic light increase the photopolymerization rate, have already been described. A survey of such photopolymerization initiators has been given by G. Delzenne in Ind. Chim. Belge, 24 (1959) 739–764.

An object of the present invention is to provide a new class of photopolymerization initiators that can be activated by actinic light.

Another object of the present invention is to provide a new class of photopolymerization initiators that require a very short exposure to actinic light.

According to the present invention a process is provided for the photopolymerization of ethylenically unsaturated organic compounds, which process comprises irradiating with actinic light a composition comprising a photopolymerizable ethylenically unsaturated organic compound and as a photopolymerization initiator a compound containing at least one diacyldiazomethane group, said compound corresponding to one of the following general formulae:

$$X-\underset{\underset{N_2}{\|}}{C}-Y$$

and $$X-\underset{\underset{N}{\|}}{C}-SO_2-Z-SO_2-\underset{\underset{N_2}{\|}}{C}-Y$$

wherein each of X and Y (same or different) represents an acyl group, selected from R—$SO_2$— and R′—CO— with R representing a phenyl group, a naphthyl group, a halogen-substituted phenyl group, an alkyl-substituted phenyl group, wherein the alkyl group comprises 1 to 12 carbon atoms, a nitro-substituted phenyl group, or a carboxyl-substituted phenyl group, wherein the carboxyl group occurs in free acid form or as an alkaline metal salt group, or as an alkyl or a phenyl ester group, and R′ representing a phenyl group, a naphthyl group, a bezofuran group, a halogen-substituted phenyl group, an alkyl-substituted phenyl group, wherein the alkyl group comprises 1 to 4 carbon atoms, an alkoxy-substituted phenyl group, wherein the alkoxy group comprises 1 to 16 carbon atoms, a nitro-substituted phenyl group, a dialkylamino-substituted phenyl group, wherein the alkyl groups comprise 1 to 4 carbon atoms, or a carboxyl-substituted phenyl group, wherein the carboxyl group occurs in free acid form or as an alkali metal salt group, or as an alkyl or a phenyl ester group, and Z represents an alkylene group of 2 to 4 carbon atoms, or a phenylene group.

Examples of suitable photopolymerization initiators are:

(1) bis(phenylsulphonyl)-diazomethane
(2) bis(4-chlorophenylsulphonyl)-diazomethane
(3) bis(4-tolylsulphonyl)-diazomethane
(4) bis(4-nitrophenylsulphonyl)-diazomethane
(5) bis(2-naphthylsulphonyl)-diazomethane
(6) (phenylsulphonyl)-(phenylcarbonyl)-diazomethane
(7) (phenylsulphonyl)-(4-methylphenylcarbonyl)-diazomethane
(8) (phenylsulphonyl)-(4-fluorophenylcarbonyl)-diazomethane
(9) (phenylsulphonyl)-(4-chlorophenylcarbonyl)-diazomethane
(10) (phenylsulphonyl)-(4-bromophenylcarbonyl)-diazomethane
(11) (phenylsulphonyl)-(4-iodophenylcarbonyl)-diazomethane
(12) (phenylsulphony)-(4-nitrophenylcarbonyl)-diazomethane
(13) (phenylsulphony)-(4-methoxyphenylcarbonyl)-diazomethane
(14) (phenylsulphonyl)-(4-hexadecyloxyphenylcarbonyl)-diazomethane
(15) (phenylsulphonyl)-(1-naphthylcarbonyl)-diazomethane
(16) (phenylsulphonyl)-(2-benzofurancarbonyl)-diazomethane
(17) (3-carboxyphenylsulphonyl)-(4-carboxyphenylcarbonyl)-diazomethane
(18) sodium salt of (3-carboxyphenylsulphonyl)-4-carboxyphenylcarbonyl)-diazomethane
(19) (4-tolysulphonyl)-(4-dimethylaminophenylcarbonyl)-diazomethane
(20) (4-tolylsulphonyl)-(4-azidophenylcarbonyl)-diazomethane
(21) (dodecylsulphonyl)-(phenylcarbonyl)-diazomethane
(22) bis(phenylcarbonyl)-diazomethane
(23) 1,4-bis(benzenecarbonyldiazomethylsulphonyl)-butane.

The compounds corresponding to the general formula:

$$R—SO_2—\underset{\underset{N_2}{\|}}{C}—SO_2—R$$

are prepared according to a method described by Klages and Bott, Chem.Ber. 97 (1964) 735–740. This method is illustrated by the following reaction scheme:

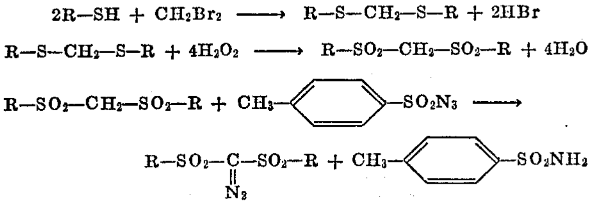

The compounds corresponding to the general formula:

$$R—SO_2—\underset{\underset{N_2}{\|}}{C}—CO—R'$$

are prepared similarly but by reaction of p-toluene-sulphonylazide with a β-ketosulphony derivative. The reaction scheme is as follows:

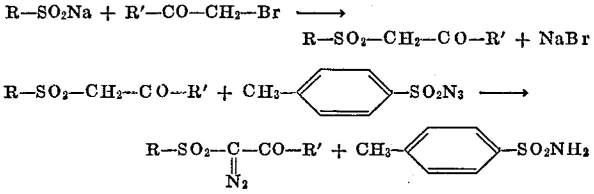

The compounds corresponding to the general formula:

$$R'—CO—\underset{\underset{N_2}{\|}}{C}—CO—R'$$

are prepared analogously according to the preceding reaction scheme, but starting from a corresponding β-diketone.

The bis(diazomethane) derivatives are synthetized analogously starting from bis-sulphinic acid sodium salt derivatives.

The quantity of photopolymerization initiator to be used depends, of course, on many variable including the nature of the initiator used, the wavelength of light employed, the irradiation time and the monomer or monomers present. Usually, the amount of photopolymerization initiator is within the range of 0.01 to 5% by weight based on the amount of monomeric material initially present. It is seldom necessary to employ more than 0.2 to 2% by weight to obtain a good polymerization rate.

The ethylenically unsaturated organic compounds may be exposed to any radiation source emitting actinic light rays in the wavelength range of 2500 to 4000 A., particularly in the wavelength region of 3000 to 4000 A. Suitable radiation source include carbon arcs, mercury vapour lamps, fluorescent lamps, argon lamps, photographic flood lamps, tungsten lamps, flash lamps and lasers. Moreover, ordinary daylight may be used too.

A considerable increase in the rate of polymerization can be obtained by adding activating dyes selected from the class of acridine, phenazine, thiazine, oxazine, xanthene, quinoline, anthraquinone, indigo, methine and benzothiazole dyes, and more particularly photo-oxidation sensitizers in a concentration of 0.001 to 0.1% by weight based on the monomeric material present. In this case the useful wavelength range can be extended up to 7000 A.

The photopolymerization can be carried out according to any of the well-known processes e.g. bulk, emulsion suspension, and solution polymerization processes. In all these processes, the addition of a photopolymerization initiator according to the invention to polymerisable materials subjected to the action of actinic light greatly increase the rate of photopolymerization.

A base or support may be coated with a solution of the photopolymerisable organic compound in a solvent therefor, this solution containing in dissolved state or homogeneously dispersed therein a photopolymerization initiator according to the invention, whereupon the solvent or solvent mixture is eliminated by known means such as evaporation, thus leaving a more or less thin coating of the photopolymerisable organic compound on the base or support. Subsequently, the dried photopolymerisable coating is exposed to actinic light rays.

When exposing the photopolymerisable composition to actinic light rays, the polymerization does not start immediately. Only after a short period, which depends i.e. on the nature of the ethylenically unsaturated organic compound(s), of the photopolymerization initiator and of the light-intensity used, the photopolymerization starts. The period necessary for obtaining a perceptible amount of polymerization is a measure of the efficiency of the photopolymerization initiator, and is named the inhibition period.

In some circumstances it may be desirable that the photopolymerisable composition comprises a hydrophilic or hydrophobic colloid as carrier or binding agent for the ethylenically unsaturated organic compounds and the photopolymerization initiator. The properties of the light-sensitive layer are highly influenced, of course, by the presence of this binding agent. The choice of the binding agent is determined by its solubility in solvents, which can also be used as solvents for the ethylenically unsaturated organic compounds and for the photopolymerization initiator of the invention. Such binding agents are e.g. polystyrene, polymethyl methacrylate, polyvinyl acetate, polyvinyl butylral, partially saponified cellulose acetate and other polymers that are soluble in solvents for initiators and monomers. In some cases water-soluble polymers e.g. gelatin, casein, starch, carboxymethyl cellulose and polyvinyl alcohol can be used. It is obvious that the ratio of photopolymerizable monomer(s) to binding agent also influences the photopolymerization. The higher this ratio, the higher is the photopolymerization rate generally of a particular ethylenically unsaturated organic compound.

If the photopolymerizable composition is soluble in water, water may be used as a solvent for the coating composition. On the contrary, if water-insoluble photopolymerizable compositions are used, organic solvents, mixtures of organic solvents, or mixtures of organic solvents and water may be used.

The process of the invention is applied to the photopolymerization of compositions comprising ethylenically unsaturated organic compounds. These compositions may comprise one or more ethylenically unsaturated polymerizable compounds such as styrene, acrylamide, methacrylamide, methyl methacrylate, and acrylonitrile. When two of these monomers are used in the same photopolymerizable composition or if they are mixed with other polymerizable compounds, copolymers are formed during the photopolymerization. If the photopolymerizable material is used together with a polymeric binding agent, graft copolymers are formed between the polymeric binder and the photopolymerized material.

The photopolymerizable composition may also comprise or consist of unsaturated compounds having more than one carbon-carbon double bond, e.g. two terminal vinyl groups, or of an ethylenically unsaturated polymeric compound. During polymerization of these compositions cross-linking will occur usually by means of the plurally unsaturated compounds. Examples of compounds containing more than one carbon-carbon double bond are e.g. divinylbenzene, diglycol diacrylates, and N,N'-alkylene-bis-acrylamides. Examples of ethylenically unsaturated polymeric compounds are e.g. allyl esters of polyacrylic acid, maleic esters of polyvinyl alcohol, polyhydrocarbons still containing carbon-carbon double bonds, unsaturated polyesters, unsaturated polyethers such as those formed by reaction of acryloyl chloride with the free hydroxyl substituents in the polyether obtained by the polycondensation of 2,2-bis(4-hydroxyphenyl)-propane and epichlorhydrin, cellulose acetomaleates, and allyl cellulose.

In the photopolymerization of ethylenically unsaturated compounds with photopolymerization initiators of the invention high temperatures are not needed. The exposure, however, to intense radiation sources at a relatively short distance brings about a certain heating of the mass to be polymerized, which heating exercises a favourable influence upon the polymerization rate.

The products of the invention are useful as adhesives, coating and impregnating agents, safety glass interlayers, etc. When the photopolymerization of the composition is carried out within a mold, optical articles such as lenses can be obtained.

The photopolymerizatible compositions, which contain photopolymerization initiators according to the invention, are useful in the preparation of photographic images. In this respect the present invention also comprises spreading the polymerizable composition upon a surface such as a surface of metal and printing a design thereon photographically by exposure to light through a suitable image pattern. The light induces polymerization at the exposed portions of the photopolymerization compositions, so that the polymeric layer is rendered insoluble image-wise in the solvent or solvents used for applying the photopolymerizable layer. Subsequently, the non-exposed portions are washed away with a solvent for the monomeric material. In this way printing plates and photographic resist images are manufactured, which can be used further as planographic printing plates, printing masters, screens for silkscreen printing, and photo-resists for etching.

If a monomer is used that forms an insoluble polymer in the polymerizing medium light-scattering polymeric particles are formed by irradiation; by this method a directly visible image is obtained without development.

The image-wise photopolymerization can also induce differential softening properties to the layer. This makes possible a reproduction process by material transfer when the image-wise photopolymerized layer is subsequently warmed up and pressed against a receiving sheet, so that the softened areas are transferred to the receiving sheet.

By incorporation of suitable dye-forming reagents into the light-sensitive layer, the inertness of said reagents can be obtained upon photopolymerization. During a subsequent thermal transfer step a positive image of the original can be obtained on a receiving sheet.

The following examples illustrate the present invention.

EXAMPLE 1

60 g. of acrylamide were dissolve in 100 ml. of distilled water and 10 mg. of erythrosine were dissolved in 100 ml. of ethylene glycol monomethyl ether.

In a series of glass tubes 7.5 ml. of the above-mentioned acrylamide solution and 1 ml. of the erythrosine solution were mixed. To each tube was then added $10^{-5}$ mole of photopolymerization initiator as indicated below, dissolved in 4 ml. of ethylene glycol monomethyl ether.

A series of comparative test solutions of the same composition, but containing no erythrosine solution was made also.

The tubes containing the different solutions were exposed to an 80 watt high-pressure mercury vapour lamp placed at a distance of 10 cm. As a result thereof and depending on the nature of the particular photopolymerization initiator used as well as on the presence or absence of erythrosine as activating dyestuff, the solutions first became viscous and afterwards became solid thus representing a polymer yield of 90 to 95%. The results of the exposure test are shown in Table 1.

TABLE 1

| Photopolymerization initiator | | Reaction time [1] | |
|---|---|---|---|
| No.[2] | Amount present, mg. | Without erythrosine, minutes | With erythrosine, minutes |
| 2 | 4 | >60 | 6 |
| 5 | 4.5 | 38 | 10 |
| 7 | 3 | 120 | 12 |
| 8 | 3 | >120 | 12 |
| 10 | 3.7 | 60 | 11½ |
| 11 | 4.2 | >60 | 7 |
| 12 | 3.5 | >60 | 6½ |
| 13 | 3.2 | 47 | 9 |
| 14 | 5.3 | >60 | 17 |
| 15 | 3.4 | 37 | 12 |
| 17 | 3.7 | 90 | 18 |
| 18 | 4.2 | >120 | 33 |
| 20 | 3.4 | 120 | 11 |
| 21 | 3.8 | >60 | 21 |
| 23 | 3.7 | >120 | 15 |

[1] Reaction time at which the polymerization mixture solidifies.
[2] The numbers refer to the numbers of the particular polymerization nitiators give above.

EXAMPLE 2

3 g. of acrylamide were dissolved in a mixture of 5 ml. of ethylene glycol monomethyl ether and 5 ml. of water. To this solution were added 0.5 mg. of Rose Bengale as photopolymerization initiator and 2.5 mg. of bis(phenylcarbonyl)-diazomethane. The resulting solution was poured into a chemically and heat-resistant glass tube. Exposure occurred with an 80 watt high-pressure mercury vapour lamp placed at a distance of 10 cm. After 20 minutes of exposure solid polyacrylamide was obtained.

EXAMPLE 3

3 g. of acrylamide were dissolved in a mixture of 5 ml. of ethylene glycol monomethyl ether and 5 ml. of water. Then 1 mg. of rose bengale and 5 mg. of (4-tolylsulphonyl)-(4 - dimethylaminophenyl carbonyl)-diazomethane as photopolymerization initiator were added to the resulting solution. The exposure was carried out as described in Example 2. Solid polyacrylamide was obtained after an exposure of 1 hour.

EXAMPLE 4

60 g. of acrylamide were dissolved in 100 ml. of water. In each of 6 glass tubes 7.5 ml. of this solution were poured and 3.2 mg. of a polymerization initiator dissolved in a quantity of ethylene glycol monomethyl ether as indicated below were added thereto. To three of these glass tubes 1 ml. of a Rose Bengale solution was added.

The tubes were exposed to an 80 watt high-pressure mercury vapor lamp placed at a distance of 15 cm. Depending on the particular composition, the solutions first became viscous and solid afterwards, thus representing a polymer yield of 90 to 95%. The results of the exposure tests are given in Table 2.

TABLE 2

| Photopolymerization initiator [1] Number: | Activating dyestuff,[2] ml. | Amount of ethylene glycol monomethyl ether, ml. | Solid after (min.)— |
|---|---|---|---|
| 1 | | 4 | 80 |
| 1 | 1 | 3 | 10 |
| 4 | | 4 | 60 |
| 4 | 1 | 3 | 10 |
| 7 | | 4 | 70 |
| 7 | 1 | 3 | 7 |

[1] The numbers refer to the numbers of the particular polymerization initiators given above.
[2] 10 mg. of Rose Bengale dissolved in 10 ml. ethylene glycol monomethyl ether.

EXAMPLE 5

In each of 5 glass tubes were dissolved 25 g. of acrylamide and 32.2 mg. of bis(phenylsulphonyl)-diazomethane in a mixture of 50 ml. of water and 50 ml. of ethylene glycol monomethyl ether. To each solution $10^{-6}$ mole of an activating dyestuff were added. As dyestuffs were used:

(1) Isoquinoline red: C.I. 47.040
(2) Alizarine cyanine green: C.I. 61.595
(3) Indigosol blue AGG powder: C.I. 73.801
(4) Tolusafranine: C.I. 50.240
(5) A methine dyestuff of the following formula:

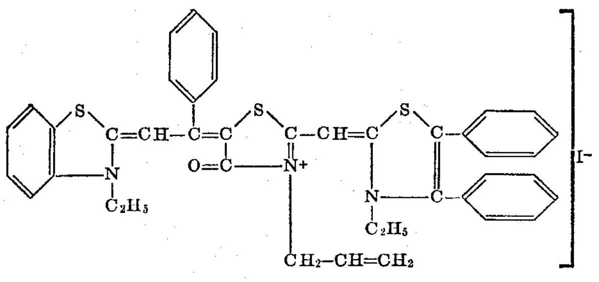

The solutions were exposed to a 300 watt tungsten lamp placed at a distance of 15 cm. Depending on the particular composition, the solutions first became viscous and solid afterwards. The results were as follows:

(1) with Isoquinoline red: solid after 52 minutes
(2) with Alizarine cyanine green: solid after 120 minutes
(3) with Indigosol blue: polymerisation starts after 40 minutes
(4) with Tolusafranine: polymerisation starts after 120 minutes
(5) with methine dyestuff: polymerisation starts after 35 minutes

EXAMPLE 6

60 g. of acrylamide were dissolved in 100 ml. of distilled water and 10 mg. of a sensitizing dye were dissolved in 100 ml. of ethyleneglycol monomethyl ether.

In a series of glass tubes 7.5 ml. of the above mentioned acrylamide solution and 1 ml. of the dye solution were mixed. To each tube were added 4 mg. of bis(4-chlorophenylsulphonyl)-diazomethane dissolved in 4 ml. of ethylene glycol monomethyl ether. Some of these tubes were irradiated with a 80 watt high-pressure mercury vapour lamp placed at a distance of 10 cm. The remainder of these tubes was irradiated with a 300 watt tungsten lamp also placed at a distance of 10 cm.

As a result of the exposure and depending also on the nature of the sensitizing dye, the solution first became viscous and solid afterwards thus representing a polymer yield of 90 to 95%. The results of the exposure tests are shown in Table 3.

TABLE 3

| Activating dye | Reaction time [1] UV-radiation (80 watt) | Visible light (300 watt) |
|---|---|---|
| Thioflavine | 25 minutes | 30 minutes. |
| Flaveosine | 5 minutes | 5 minutes. |
| Benzoflavine | 10 minutes | 10 minutes. |
| Euchrysine | 7 minutes | 7 minutes. |
| Saframine | 19 minutes | |

[1] Reaction time at which the polymerization mixture solidifies.

EXAMPLE 7

In 1 litre of mixture of water and ethylene glycol monomethyl ether (50:50) 15% by weight of gelatin, 5% by weight of acrylamide, 1% by weight of methylene-bis-acrylamide, $10^{-2}$ mole of bis(phenylsulphonyl)-diazomethane as photopolymerization initiator, and $2.10^{-3}$ moles of erythrosine as activating dyestuff were dissolved.

The solution obtained was applied to a subbed polyethylene terephthalate film in such a way that upon drying a layer of approximatively 5 microns was obtained.

This resulting layer was exposed for 6 seconds through a line positive in a 3M Photocopier M172 (trade name). The exposed portions of the layer became insoluble in water, whereas the non-exposed portions could be washed away easily with water of 35 to 40° C.

A negative relief image of the original was obtained.

EXAMPLE 8

The solution prepared in Example 6 and containing gelatin, acrylamide, methylene-bis-acrylamide, bis(phenylsulphonyl)-diazomethane and erythrosine dissolved in a mixture of water and ethylene glycol monomethyl ether (50:50) was coated on an aluminum foil in such a way that upon drying a layer of approximatively 5 microns was obtained.

This layer was exposed for 1 minute through a line positive to an 80 watt high-pressure mercury vapour lamp placed at a distance of 15 cm. The exposed portions of the layer became insoluble in water, whereas the non-exposed portions could be washed away easily with water of 35 to 40° C. A negative printing plate of the original was obtained.

EXAMPLE 9

0.05 g. of bis(phenylsulphonyl)-diazomethane, 0.02 g. of toluidine blue, and 0.01 g. of 2,6-di-tert.butyl-p-cresol were added to 20 ml. of acetone. The resulting solution was filtered and then admixed in the dark while shaking until complete dissolution with 5 g. of the copolymer of ethylene and maleic anhydride (50:50 mole percent) and 1.5 g. of acrylamide.

The solution was applied to an aluminum foil and dried at 60° C. The resulting layer was exposed for 5 minutes through a line positive to an 80 watt high-pressure mercury vapour lamp placed at a distance of 15 cm. The non-exposed portions of the layer were washed away with acetone.

A negative of the original image remained. It could be used as a printing plate.

EXAMPLE 10

The process of Example 9 was repeated with the difference, however, that the toluidine blue was replaced by a same amount of thionine.

After an exposure of 5 minutes and washing away of the nonexposed portions of the layer, a line negative relief image of the original was obtained.

EXAMPLE 11

The process of Example 9 was repeated with the difference, however, that the toluidine blue was replaced by same amount of erythrosine. After an exposure of 5 minutes and development in acetone a line negative of the original was obtained.

EXAMPLE 12

The following solution was prepared:

bis(phenylsulphonyl)-diazomethane—0.1 g.
methylene blue—0.04 g.
2,6-di-tert.-butyl-p-cresol—0.02 g.
acetone—40 ml.

5 g. of the copolymer of ethylene and maleic anhydride (50:50 mole percent) and 1.5 g. of acrylamide were added in the dark whilst shaking to the resulting solution. After complete dissolution the solution was applied to an aluminium foil in such a way that upon drying a layer of 4 microns was obtained. This layer was exposed through a line positive to an 80 watt high-pressure mercury vapour lamp placed at a distance of 15 cm. After an exposure of 2 minutes the non-exposed portions could be washed away with acetone, so that a line negative image of the original remained, which could be used directly as a printing plate.

EXAMPLE 13

The following solution was prepared:

bis(phenylsulphonyl)-diazomethane—0.05 g.
methylene blue—0.2 g.
2,6-di-tert.butyl-p-cresol—0.01 g.
acetone—20 ml.

5 g. of the copolymer of ethylene and maleic anhydride (50:50 mole percent) and 2 ml. of ethylene glycol diacrylate were added in the dark whilst shaking to this solution.

A layer of 30μ was coated therefrom on an aluminium foil and dried at 60° C. The resulting layer was exposed for 10 min. through a line positive with an 80 watt high-pressure mercury vapour lamp placed at a distance of 15 cm. The exposed portions of the layer were insolubilized. The non-exposed portions could be washed away with acetone so that a line relief image was obtained.

EXAMPLE 14

2,2-bis(4-hydroxyphenyl)-propane was polycondensed with epichlorhydrin and the polyether formed was made to react with acryloyl chloride so as to obtain a polyether with unsaturated side-substituents. Of this modified polyether 5 g. were dissolved in a mixture of 50 ml. of methylene chloride and 50 ml. of dioxane, together with 705 mg. of bis(phenylsulphonyl)-diazomethane, 100 mg. of 2,6-di-tert.-butyl-p-cresol and 753 mg. of the dyestuff of the formula:

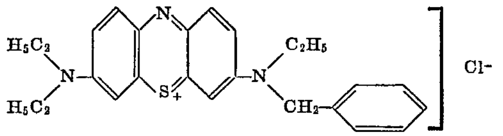

The solution formed was applied to an aluminium foil such that after drying at 50° C. a layer of 5μ was obtained. The resulting layer was exposed for 3 min. through a line positive with a 300 watt lamp placed at a distance of 15 cm. The exposed portions of the layer were insolubilized. The non-exposed portions could be washed away with n-butanone so that a relief image was formed.

EXAMPLE 15

3 g. of the unsaturated polyether formed in Example 14 were dissolved in 100 ml. of xylene together with 705 mg. of bis(phenylsulphonyl)-diazomethane, 12 mg. of 2,6-di-tert.butyl-p-cresol, and 218 mg. of the dyestuff of Example 14.

The solution formed was coated on a subbed cellulose triacetate film in such a way, that after drying at 50° C. a layer of 5μ remained. The layer was exposed in reflux with a 300 watt lamp at a distance of 15 cm. through a line positive. The non-exposed portions of the layer could be washed away with xylene. An exposure of 2 minutes was sufficient to obtain a negative relief image of the original.

EXAMPLE 16

3 g. of the unsaturated polyether formed in Example 14 were dissolved in a mixture of 50 ml. of xylene and 50 ml. of methyl glycol acetate, together with 705 mg. of bis(phenylsulphonyl)diazomethane, 52 mg. of Rose Bengale and 12 mg. of 2,6-di-tert.-butyl-p-cresol.

The solution formed was coated on an aluminium foil, such that after drying at 50° C. a layer of 2.5μ was formed.

Exposure occurred as in Example 15 and the non-exposed portions of the layer were washed away with xylene. An exposure time of 8 minutes was needed to form a good relief image.

We claim:

1. A process for the photopolymerization of ethylenically unsaturated organic compounds comprising irradiating with actinic light a composition containing a photopolymerizable ethylenically unsaturated organic compound and as a photopolymerization initiator a compound containing at least one diacyldiazomethane group, said compound corresponding to one of the following general formulae:

$$X-\underset{\underset{N_2}{\|}}{C}-Y$$

and $$X-\underset{\underset{N_2}{\|}}{C}-SO_2-Z-SO_2-\underset{\underset{N_2}{\|}}{C}-Y$$

wherein:

each of X and Y (same or different) represents acyl groups selected from R—$SO_2$— and R′—CO— with R representing a phenyl group, a naphthyl group, a halogen-substituted phenyl group, an alykl-substituted phenyl group, wherein the alkyl group comprises 1 to 12 carbon atoms, a nitro-substituted phenyl group, or a carboxyl-substituted phenyl group, wherein the carboxyl group occurs in free acid form or as an alkaline metal salt group, or as an alkyl or a phenyl ester group, and with R′ representing a phenyl group, a naphthyl group, a benzofuran group, a halogen-substituted phenyl group, an alkyl-substituted phenyl group, wherein the alkyl group comprises 1 to 4 carbon atoms, an alkoxy-substituted phenyl group, wherein the alkoxy group comprises 1 to 16 carbon atoms, a nitro-substituted phenyl group, a dialkylamino-substituted phenyl group, wherein the alkyl groups comprise 1 to 4 carbon atoms, or a carboxyl-substituted phenyl group, wherein the carboxyl group occurs in free acid form or as an alkali metal salt group, or as an alkyl or a phenyl ester group, and Z represents an alkylene group of 2 to 4 carbon atoms or a phenylene group.

2. A process according to claim 1, wherein a radiation source is used emitting light in the wavelength range of 2500 to 4000 A.

3. A process according to claim 1, wherein a radiation source is used emitting light in the wavelength range of 2500–7000 A. and wherein a photo-oxidation sensitizer of the class consisting of acridine, phenazine, thiazine, oxazine, xanthene, quinoline, anthraquinone, indigo, methine and benzothiazole dyes is present in the photopolymerization composition in an amount between 0.001 and 0.1% by weight in relation to the ethylenically unsaturated organic compound present.

4. A process according to claim 1, wherein the photopolymerization initiator is bis(phenylsulphonyl)-diazomethane.

5. A process according to claim 1, wherein the photopolymerization initiator is bis(4-tolylsulphonyl)-diazomethane.

6. A process according to claim 1, wherein the photopolymerization initiator is bis(4-chlorophenylsulphonyl)-diazomethane.

7. A process according to claim 1, wherein the photopolymerization initiator is (phenylsulphonyl)-(4-methylphenylcarbonyl)-diazomethane.

8. A process according to claim 1, wherein the photopolymerization initiator is (phenylsulphonyl)-(4-nitrophenylcarbonyl)-diazomethane.

9. A process according to claim 1, wherein the photopolymerization initiator is (phenylsulphonyl)-(4-methoxyphenylcarbonyl)diazomethane.

10. A process of producing a polymeric photographic relief image, which comprises exposing to a pattern of actinic light a photographic element comprising a support and a light-sensitive layer containing a photopolymerizable ethylenically unsaturated organic compound and as a photopolymerization initiator a compound containing at least one diacyldiazomethane group, said compound corresponding to one of the following geenral formulae:

$$X-\underset{\underset{\displaystyle N_2}{\|}}{C}-Y$$

and $$X-\underset{\underset{\displaystyle N_2}{\|}}{C}-SO_2-Z-SO_2-\underset{\underset{\displaystyle N_2}{\|}}{C}-Y$$

wherein:

each of X and Y (same or different) represents acyl groups selected from R—$SO_2$— and R′—CO— with R representing a phenyl group, a naphthyl group, a halogen-substituted phenyl group, an alkyl-substituted phenyl group, wherein the alkyl group comprises 1 to 12 carbon atoms, a nitro-substituted phenyl group, or a carboxyl-substituted phenyl group, wherein the carboxyl group occurs in free acid form or as an alkaline metal salt group, or as an alkyl or a phenyl ester group, and with R′ representing a phenyl group, a naphthyl group, a benzofuran group, a halogen-substituted phenyl group, an alkyl-substituted phenyl group, wherein the alkyl group comprises 1 to 4 carbon atoms, an alkoxy-substituted phenyl group, wherein the alkoxy group comprises 1 to 16 carbon atoms, a nitro-substituted phenyl group, a dialkylamino-substituted phenyl group, wherein the alkyl groups comprise 1 to 4 carbon atoms, or a carboxyl-substituted phenyl group, wherein the carboxyl group occurs in free acid form or as an alkali metal salt group, or as an alkyl or a phenyl ester group, and Z represents an alkylene group of 2 to 4 carbon atoms or a phenylene group, the exposure being of such an extent that said photopolymerizable ethylenically unsaturated organic compound is polymerized in the exposed areas, and removing the unexposed portions of the layer with a solvent for said photopolymerizable ethylenically unsaturated organic compound, thereby leaving a polymeric photographic relief image of said pattern of actinic light.

11. A process according to claim 10, wherein the pattern of actinic light has a wavelength of 2500 to 4000 A.

12. A process according to claim 10, wherein the pattern of actinic light radiation has a wavelength of 2500 to 7000 A. and wherein the light-sensitive layer also comprises a photo-oxidation sensitizer of the class consisting of acridine, phenazine, thiazine, oxazine, xanthene, quinoline, anthroquinone, indigo, methine and benzothiazole dyes in an amount between 0.001 and 0.1% by weight in relation to the ethylenically unsaturated organic compound present.

13. A photographic element comprising a support and a light-sensitive layer containing a photopolymerizable ethylenically unsaturated organic compound and as a photopolymerization initiator a compound containing at least one diacyldiazomethane group, said compound corresponding to one of the following general formulae:

$$X-\underset{\underset{\displaystyle N_2}{\|}}{C}-Y$$

and $$X-\underset{\underset{\displaystyle N_2}{\|}}{C}-SO_2-Z-SO_2-\underset{\underset{\displaystyle N_2}{\|}}{C}-Y$$

wherein:

each of X and Y (same or different) represents acyl groups selected from R—$SO_2$— and R′—CO— with R representing a phenyl group, a naphthyl group, a halogen-substituted phenyl group, an alkyl-substituted phenyl group, wherein the alkyl group comprises 1 to 12 carbon atoms, a nitro-substituted phenyl group, or a carboxyl-substituted phenyl group, wherein the carboxyl group occurs in free acid form or as an alkaline metal salt group, or as an alkyl or a phenyl ester group, and with R′ representing a phenyl group, a naphthyl group, a benzofuran group, a halogen-substituted phenyl group, an alkyl-substituted phenyl group, wherein the alkyl group comprises 1 to 4 carbon atoms, an alkoxy-substituted phenyl group, wherein the alkoxy group comprises 1 to 16 carbon atoms, a nitro-substituted phenyl group, a dialkylamino-substituted phenyl group, wherein the alkyl groups comprise 1 to 4 carbon atoms, or a carboxyl-substituted phenyl group, wherein the carboxyl group occurs in free acid form or as an alkali metal salt group, or as an alkyl or a phenyl ester group, and Z represents an alkylene group of 2 to 4 carbon atoms or a phenylene group.

14. The photographic element of claim 13 wherein a photo-oxidation sensitizer of the class consisting of acridine, phenazine, thiazine, oxazine, xanthene, quinoline, anthraquinone, indigo, methine, and benzothiazole dyes is present in an amount between 0.001 and 0.1 percent by weight in relation to the ethylenically unsaturated organic compound present.

15. The photographic element of claim 13 wherein the photopolymerization initiator is bis(phenylsulphonyl)-diazomethane.

16. The photographic element of claim 13 wherein the photopolymerization initiator is bis(4-tolylsulphonyl)-diazomethane.

17. The photographic element of claim 13 wherein the photopolymerization initiator is bis(4-chlorophenylsulphonyl)-diazomethane.

18. The photographic element of claim 13 wherein the photopolymerization initiator is (phenylsulphonyl)-(4-methylphenylcarbonyl)-diazomethane.

19. The photographic element of claim 13 wherein the photopolymerization initiator is (phenylsulphonyl)-(4-nitrophenylcarbonyl)-diazomethane.

20. The photographic element of claim 13 wherein the photopolymerization initiator is (phenylsulphonyl)-(4-methoxyphenylcarbonyl)-diazomethane.

References Cited

UNITED STATES PATENTS

| | | | |
|---|---|---|---|
| 2,980,535 | 4/1961 | Schroeter | 96—115 |
| 3,146,106 | 8/1964 | Hamlin | 96—115 |

| | | | |
|---|---|---|---|
| 3,445,233 | 5/1969 | Cescon | 96—91 |
| 3,501,296 | 3/1970 | Delzenne | 96—91 |

OTHER REFERENCES

Masson et al.: "Technique of Organic Chemistry," vol. II, 1956, pp. 382–383.

NORMAN G. TORCHIN, Primary Examiner

E. C. KIMLIN, Assistant Examiner

U.S. Cl. X.R.

96—91, 35.1, 115 P; 204—159.23

UNITED STATES PATENT OFFICE
CERTIFICATE OF CORRECTION

Patent No. 3,682,642 Dated August 8, 1972

Inventor(s) Urbain Leopold LARIDON ET AL

It is certified that error appears in the above-identified patent and that said Letters Patent are hereby corrected as shown below:

Column 1, in the heading, line 6, "Cornetlaar, S2232 Gravenwezel," should read -- Cornetlaan, 2232 's-Gravenwezel, --; Column 1, in the heading, line 7, "Kenipnenveld" should read -- Konijnenveld --; Column 1, in the heading, insert the name of the Assignee as follows:

-- Gevaert-Agfa, N. V., Mortsel, Belgium --.

Column 2, lines 39-41, the formula should appear as follows:

$$X - \underset{N_2}{\overset{\|}{C}} - SO_2 - Z - SO_2 - \underset{N_2}{\overset{\|}{C}} - Y$$

Column 3, line 24, (12), "(phenylsulphony)" should read -- (phenylsulphonyl) --; Column 3, line 26, (13), "(phenylsulphony)" should read -- (phenylsulphonyl) --; Column 3, line 38, (19), (4-tolysulphonyl)" should read -- (4-tolylsulphonyl) --. Column 4, line 2, "β-ketosulphony" should read -- β-ketosulphonyl --. Column 5, line 13, "butylral" should read -- butyral --; Column 5, line 47, "compounds" should read -- compound --; Column 5, line 68, "composition" should read -- compositions --; Column 5, line 71, "photopolymerizatible" should read -- photopolymerizable --. Column 6, line 4, "compositions" should read -- composition --; Column 6, line 69, in Table 1, footnote 2, "give" should read -- given --. Column 10, line 25, "reflux" should read -- reflex --. Column 11, line 46, claim 10, "geenral" should read -- general --.

Signed and sealed this 3rd day of December 1974.

(SEAL)
Attest:

McCOY M. GIBSON JR.
Attesting Officer

C. MARSHALL DANN
Commissioner of Patents

FORM PO-1050 (10-69)

USCOMM-DC 60376-P69
☆ U.S. GOVERNMENT PRINTING OFFICE : 1969 O—366-334.